United States Patent
Chen et al.

(10) Patent No.: US 8,558,228 B2
(45) Date of Patent: Oct. 15, 2013

(54) FOUR-TERMINAL METAL-OVER-METAL CAPACITOR DESIGN KIT

(75) Inventors: Chia-Chung Chen, Keelung (TW); Chi-Feng Huang, Zhubei (TW); Tse-Hua Lu, Zhubei (TW); Sally Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 187 days.

(21) Appl. No.: 12/915,757

(22) Filed: Oct. 29, 2010

(65) Prior Publication Data

US 2012/0104387 A1     May 3, 2012

(51) Int. Cl.
    *H01L 23/58*     (2006.01)

(52) U.S. Cl.
    USPC ............. 257/48; 257/532; 257/E29.343

(58) Field of Classification Search
    USPC ................... 257/48, 532, E29.343
    See application file for complete search history.

(56) References Cited

U.S. PATENT DOCUMENTS

| | | | |
|---|---|---|---|
| 6,194,739 B1 * | 2/2001 | Ivanov et al. | 257/48 |
| 7,126,359 B2 * | 10/2006 | Huang et al. | 324/754.03 |
| 8,133,792 B2 * | 3/2012 | Liang et al. | 438/382 |
| 2004/0231885 A1 * | 11/2004 | Borland et al. | 174/260 |
| 2005/0077581 A1 | 4/2005 | Chang et al. | |

FOREIGN PATENT DOCUMENTS

| | | |
|---|---|---|
| CN | 101533840 A | 9/2009 |
| TW | 200535880 | 11/2005 |

OTHER PUBLICATIONS

Chiu et al., "A Novel Process-Controlled-Monitor Structure Suitable for RF CMOS Characterization," IEEE MTTs, 2005, (pp. 1229-1302).

Chen et al., "A Novel RF-WAT Test Structure for Advanced Process Monitoring in SOC Applications," Central R&D Division, United Microelectronics Corporation (UMC), Taiwan; IEEE International Conference on Microelectronic Test Structures, Tokyo Japan, Mar. 19-22, 2007, (5 pages).

* cited by examiner

*Primary Examiner* — Howard Weiss
(74) *Attorney, Agent, or Firm* — Slater & Matsil, L.L.P.

(57) ABSTRACT

A device includes a first MOM capacitor; a second MOM capacitor directly over and vertically overlapping the first MOM capacitor, wherein each of the first and the second MOM capacitors includes a plurality of parallel capacitor fingers; a first and a second port electrically coupled to the first MOM capacitor; and a third and a fourth port electrically coupled to the second MOM capacitor. The first, the second, the third, and the fourth ports are disposed at a surface of a respective wafer.

20 Claims, 6 Drawing Sheets

FOUR-TERMINAL METAL-OVER-METAL CAPACITOR DESIGN KIT

BACKGROUND

In the manufacturing of integrated circuits, design kits are needed to monitor process variations in order to ensure that the electrical performance of the integrated circuits is within specifications. The design kits may include metal-over-metal (MOM) capacitors designed in scribe lines of wafers.

In conventional MOM capacitor design kits, a MOM capacitor extends from the bottom metal layer to the top metal layer of the respective wafer. Two ports are formed at the surface of the wafer and connected to the two capacitor plates of the MOM capacitor. The measured capacitance and resistance may reflect the process variations in the manufacturing of the wafer.

In the integrated circuit manufacturing processes, residue moisture may undesirably remain in extreme-low-k dielectric layers, in which metal layers are formed. The residue moisture plays an important role in the performance of the MOM structure. The property of one metal layer may thus affect the overall performance of integrated circuits significantly, and hence the metal layer may need to be identified. However, the conventional MOM capacitor design kit can only be used to find the overall process variations of all metal layers. The process variation in each of the metal layers cannot be reflected. Accordingly, the specific metal layer causing the process variation reflected by the measurement result cannot be identified. Further, conventional MOM capacitor design kit takes large chip area, and is not efficient in the usage of the chip area.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel metal-over-metal (MOM) capacitor design kit is presented in accordance with an embodiment. The variations and the operation of the embodiment are then discussed. Throughout the various views and illustrative embodiments, like reference numbers are used to designate like elements.

Figure 1:
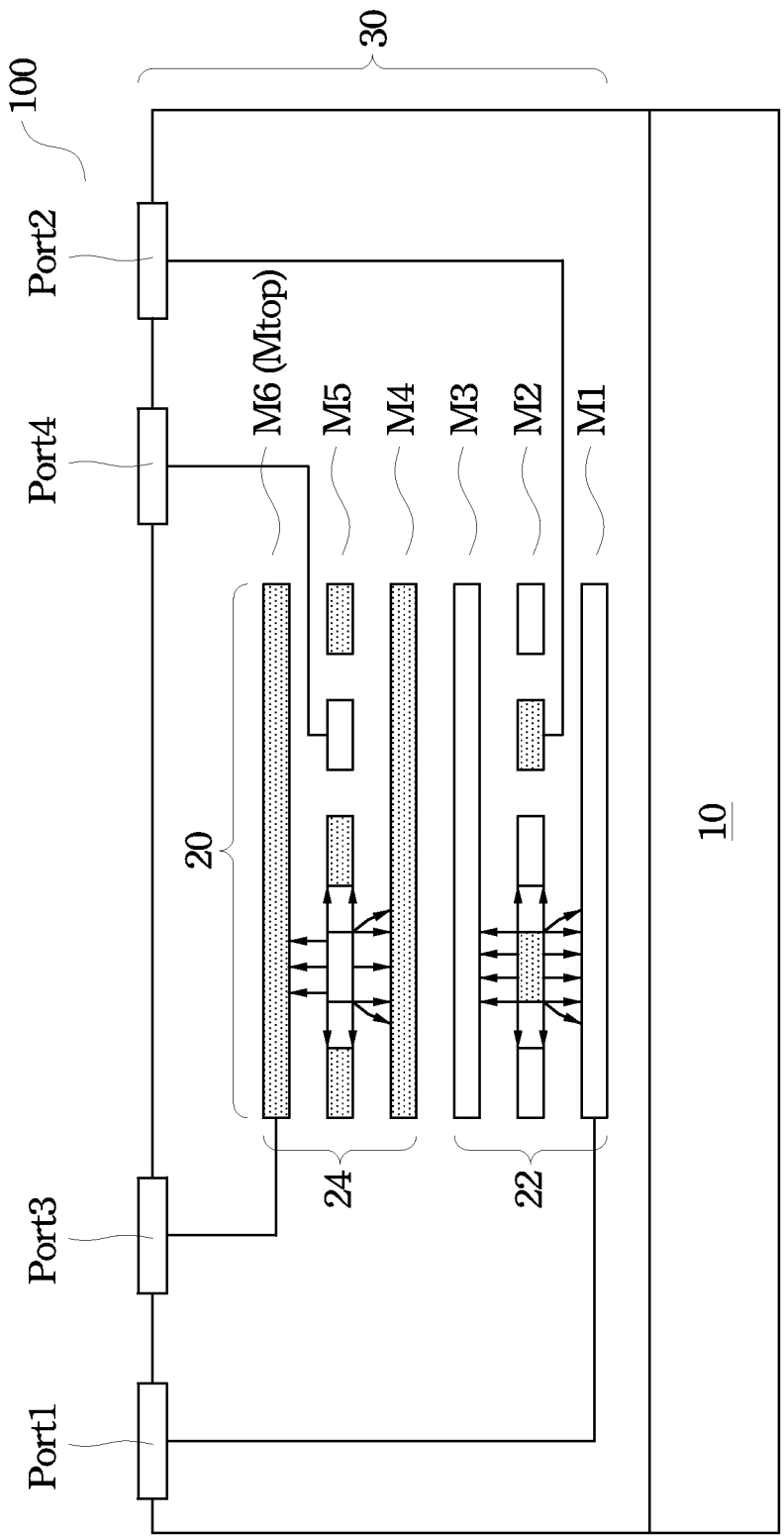
FIG. 1 illustrates a cross-sectional view of a test-key in accordance with an embodiment, wherein the test-key includes two metal-over-metal (MOM) capacitors, with one stacking over the other.

FIG. 1 illustrates a cross-sectional view of device-under-test (DUT) 20, which is a portion of MOM capacitor design kit 30 (also referred to as a test-key throughout the description). DUT 20 includes MOM capacitor 22, and MOM capacitor 24 directly over and vertically overlapping MOM capacitor 22. The capacitor plates of MOM capacitors 22 and 24 are disconnected from each other. Each of MOM capacitors 22 and 24 extends into one, or more than one, metal layer(s). Further, each of MOM capacitors 22 and 24 may include portions extending into three, or more, metal layers. Throughout the description, metal layer M1 represents the bottom metal layer of the respective wafer 100, and metal layer Mtop represents the top metal layer (which may be up to M10, for example), of wafer 100. In an embodiment, the lowest metal layer that capacitor 22 extends into may be metal layer M1 or a metal layer higher than M1, such as M2, M3, M4, M5, or the like. The highest layer that capacitor 22 extends into may be metal layer Mtop or a metal layer lower than Mtop, such as M(top−1), M(top−2), or the like. The highest layer of capacitor 22 and the lowest layer of capacitor 24 may be any layers, providing the highest metal layer of capacitor 22 is at least one layer lower than the lowest metal layer of capacitor 24. For example, in the illustrated embodiment as in FIG. 1, metal layer M6 is Mtop, and capacitor 22 extends into metal layers M1 through M3, and capacitor 24 extends into metal layers M4 through M6. Further, it is possible that one of capacitors 22 and 24 only extends into one or two metal layers, while the other one extends into some or all of the remaining metal layers. Accordingly, various combinations of DUTs having different structures may be formed by varying the lowest and highest metal layers of each of capacitors 22 and 24, and the different combinations of DUTs 20 may be formed in the same wafer 100.

Metal layers M1 through Mtop are disposed over substrate 10, which may be a semiconductor substrate. Further, measuring ports (terminals) port1, port2, port3, and port4, which are process control monitor (PCM) pads, are formed at the top surface of wafer 100. Ports port1 and port2 are connected to the two capacitor plates of capacitor 22, while ports port3 and port4 are connected to the two capacitor plates of capacitor 24.

In FIG. 1, all capacitor fingers of capacitor 22 shaded using the same pattern are interconnected, and are disconnected from all capacitor fingers of capacitor 22 shaded using another pattern. Similarly, all capacitor fingers of capacitor 24 shaded using the same pattern are interconnected, and are disconnected from all capacitor fingers of capacitor 24 shaded using another pattern.

Figure 2:
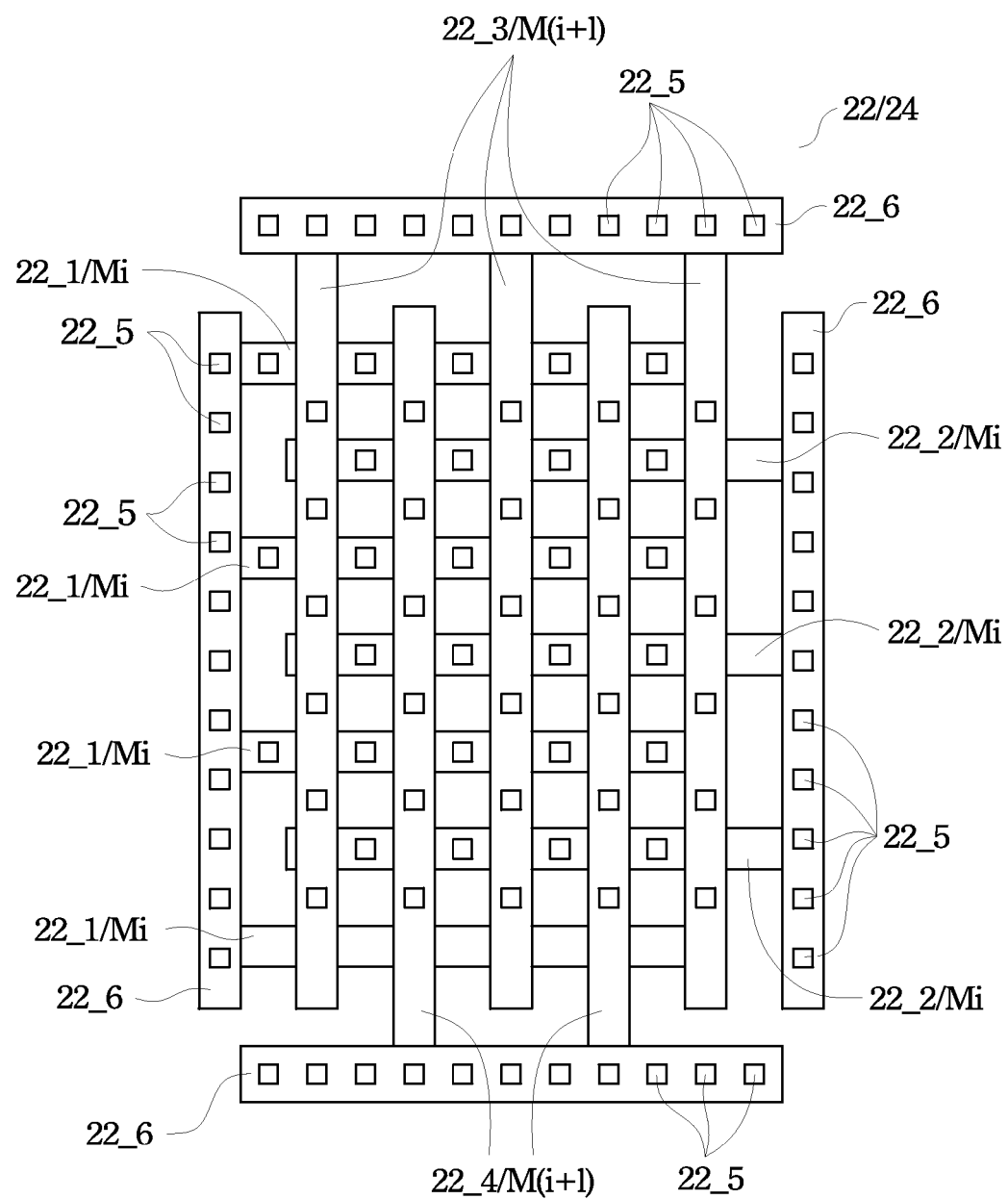
FIG. 2 illustrates a top view of portions of one of the MOM capacitors that extend into two metal layers.

Each of capacitors 22 and 24 may include the structure same as shown in FIG. 2, which is a top view of capacitor fingers 22_1, 22_2, 22_3, and 22_4 that are disposed in two neighboring metal layers. Although FIG. 2 only illustrates the components of capacitor 22, capacitor 24 may have essentially the same structure as capacitor 22. In an embodiment, assuming capacitor fingers 22_1 and 22_2 are in metal layer Mi, with i being an integer greater than zero, while capacitor fingers 22_3 and 22_4 are in metal layer M(i+1), then the longitudinal direction of capacitor fingers 22_1 and 22_2 are perpendicular to the longitudinal direction of capacitor fingers 22_3 and 22_4. In addition to the capacitor fingers as shown in FIG. 2, capacitor 22 may include portions in additional layers M(i+2), M(i+3), M(i+4) (not shown in FIG. 2), or the like, capacitor fingers of capacitor 22 in metal layer Mi, M(i+2), M(i+4), etc, may be parallel to each other. Similarly, the longitudinal directions of capacitor fingers of capacitor 22 in metal layer M(i+1), M(i+3), M(i+5), etc, may be parallel to each other. Vias 22_5 may be formed on buses 22_6 that interconnect capacitor fingers, or formed on capacitors fingers 22_1, 22_2, 22_3, and 22_4. The portions of each of the capacitor plates of each of capacitors 22 and 24 in different metal layers are interconnected through vias such as vias 22_5.

In the top view of wafer 100, capacitor 24 may occupy essentially the same area as capacitor 22, and the length and width of capacitor 24 may be essentially the same as the respective length and width of capacitor 24. Furthermore, in the top view, the corresponding outer boundaries of capacitors 22 and 24 may substantially overlap with each other, as is shown in FIG. 1. Accordingly, an entirety of capacitor 22 may substantially vertically overlap an entirety of capacitor 24. In alternative embodiments, a portion, and not an entirety, of capacitor 22 overlaps a portion of the capacitor 24.

Figure 3:
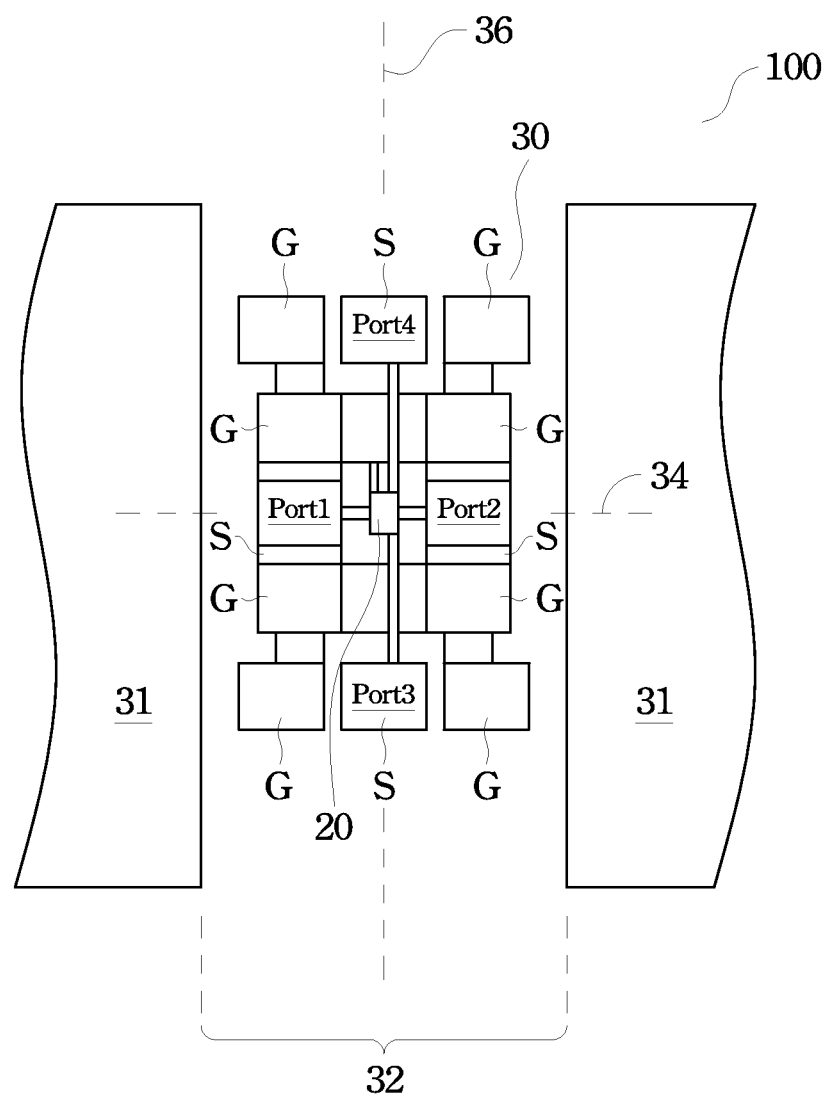
FIG. 3 illustrates a top view of a wafer comprising a test-key disposed in a scribe line of the wafer.

FIG. 3 illustrates a top view of test-key 30, which includes DUT 20, and ports port1, port2, port3, and port4 (also marked as "S," which represents "signal") electrically connected to DUT 20. Further, ground ports G are also formed in test-key 30 and are coupled to the electrical ground. Ground ports G may be electrically coupled to a part, for example, a guard ring (not shown) of DUT 20, and are electrically disconnected from ports port1, port2, port3, and port4. Test-key 30 may be formed in scribe line 32, which is located between neighboring chips 31. Scribe line 32 will be sawed to separate chips in wafer 100 in subsequent die-saw process.

Ports port1, port2, and possibly DUT 20 may be aligned to line 34, and ports port3, port4, and possibly DUT 20 may be aligned to line 36. In an embodiment, line 36 is parallel to the lengthwise direction of scribe line 32, while line 34 is perpendicular to line 36, and perpendicular to the lengthwise direction of scribe line 32. Accordingly, when measuring through ports port1 and port2, wafer 100 may be placed in a first direction, so that the probe card may contact ports port1 and port2 accurately to extract the electrical property of capacitor 22. When measuring through ports port3 and port4, wafer 100 may be rotated by 90 degrees, so that the probe card may contact ports port3 and port4 accurately to extract the electrical property of capacitor 24. Alternatively, ports port1 and port2 may be aligned to a line parallel to the lengthwise direction of scribe line 32, while ports port3 and port4 may be aligned to a line perpendicular to the lengthwise direction of scribe line 32. Capacitors 22 and 24 (not shown in FIG. 3, please refer to FIG. 1) in DUT 20 may be measured by using a probe card or probe pins to touch ports port1, port2, port3, port4, and ground ports G. By measuring the capacitance and the resistance of capacitor 22 through ports port1 and port2, the process variation of metal layers that capacitor 22 extends into (for example, metal layers M1 through M3 in FIG. 1) may be determined. Similarly, by measuring the capacitance and resistance of capacitor 24 through ports port3 and port4, the process variation of metal layers that capacitor 24 extends into (for example, metal layers M4 through M6 in FIG. 1) may be determined. Furthermore, through ports port1 and port2, the metal capacitance between capacitor fingers of capacitor 22 and the metal-to-substrate capacitance between capacitor fingers and substrate 10 (FIG. 1) may be determined. Through ports port3 and port4, the metal capacitance between capacitor fingers of capacitor 24 may be determined.

Figure 4A:
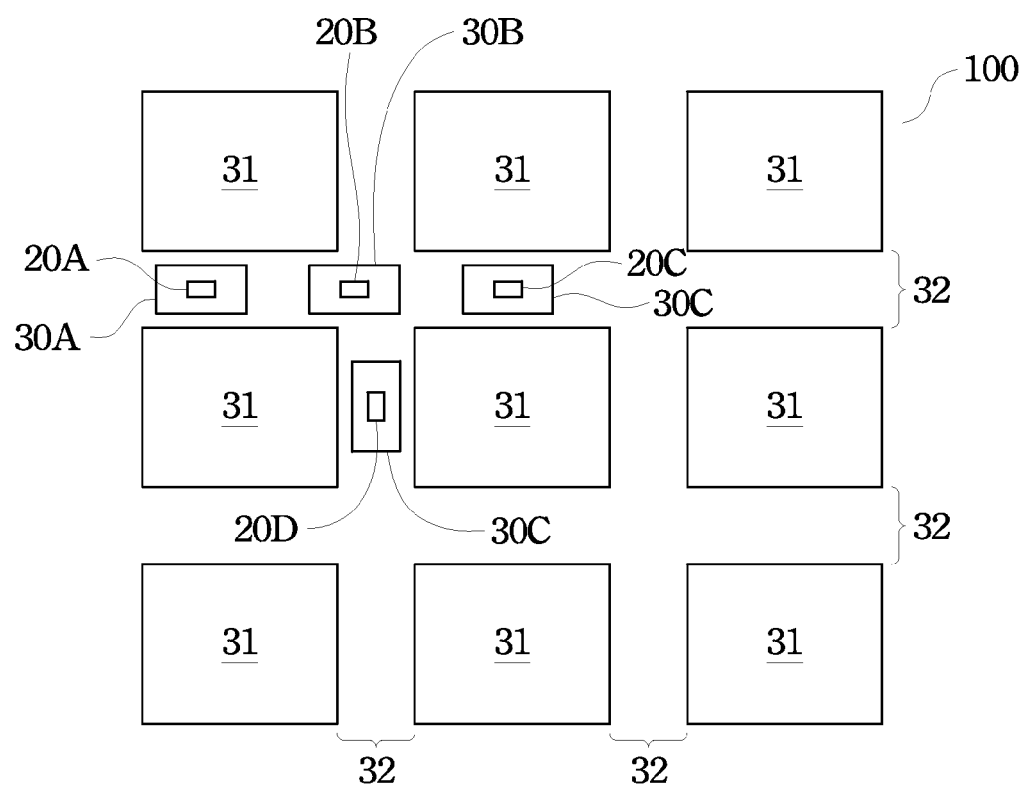
FIGS. 4A and 4B illustrate a top view and a cross-sectional view, respectively, of a plurality of test-keys that have different structures.
Figure 4B:
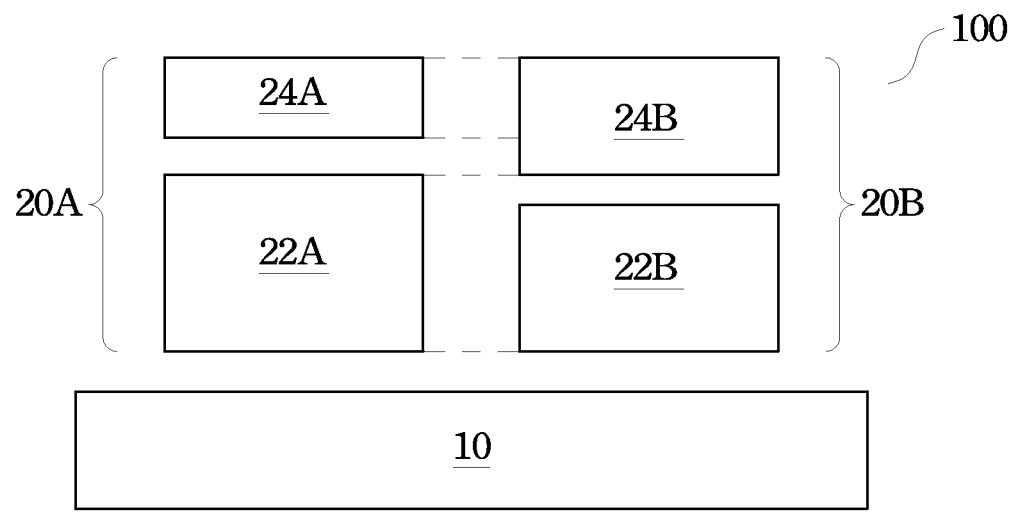

FIG. 4A schematically illustrates a top view of wafer 100, with a plurality of test-keys 30 (denoted as 30A, 30B, 30C, and 30D) in scribe lines 32 of wafer 100. DUTs 20 (including 20A, 20B, 20C, and 20D) in different test-keys 30 may have the same or different structures. For example, FIG. 4B schematically illustrates a cross-sectional view of DUTs 20A and 20B. Capacitor 22A in DUT 20A and capacitor 22B in DUT 20B may extend into different metal layers, and/or capacitor 24A in DUT 20A and capacitor 24B in DUT 20B may extend into different metal layers. The count of the metal layers which capacitor 22A extending into may be the same as, or different from, the count of the metal layers which capacitor 22B extending into. Similarly, the count of the metal layers in which capacitor 24A extending into may be the same or different from the count of the metal layers in which capacitor 24B extending into. For example, capacitor 22A may extend across metal layers M1 through M4, while capacitor 22B may extend across metal layers M1 through M3. With different test-keys 30 (FIG. 4A) having different structures and extending into different metal layers, the process variation in each of the metal layers M1 through Mtop may be extracted and calculated from the measurement results of different test-keys 30.

Figure 5:
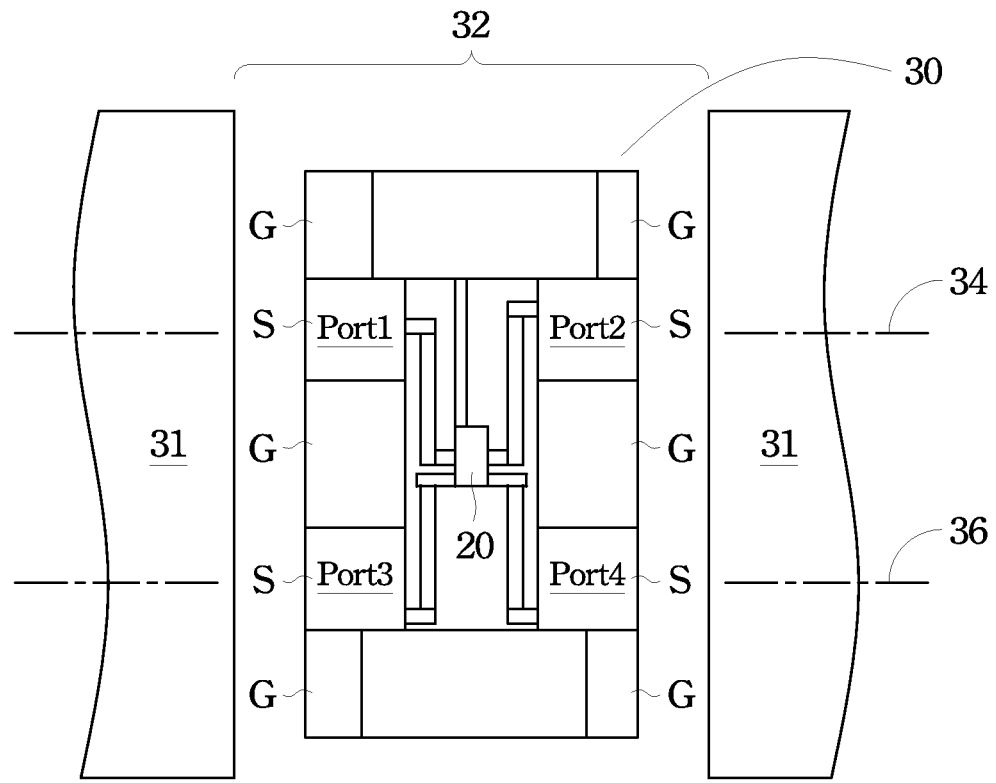
FIGS. 5 and 6 are top views of test-keys in accordance with various embodiments.
Figure 6:
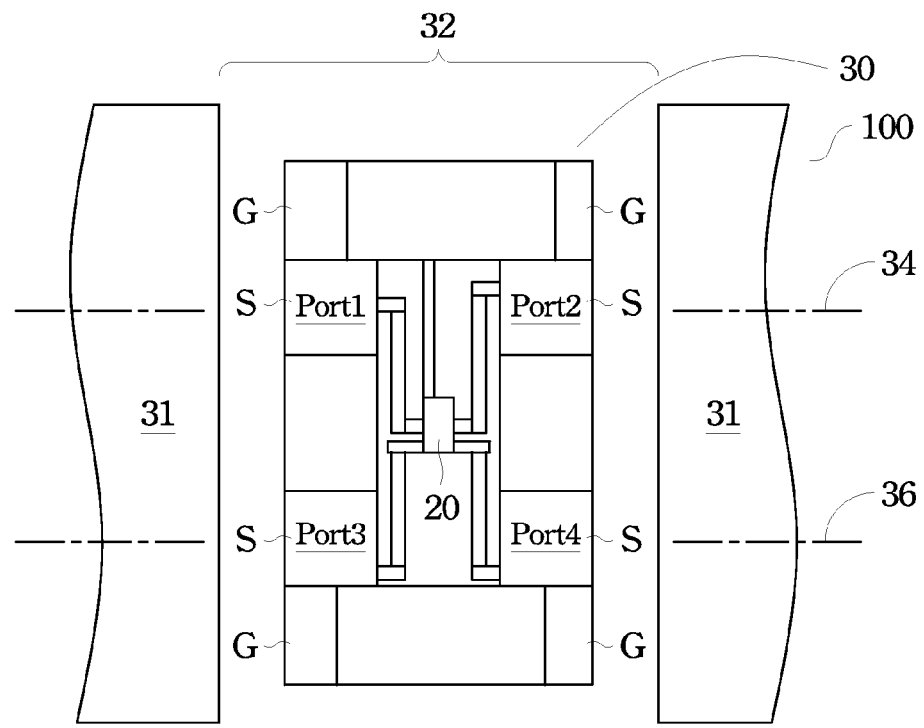

FIGS. 5 and 6 illustrate the allocation of ports port1 through port4 in accordance with alternative embodiments. FIG. 5 illustrates the allocation of a four-terminal test-key 30 according to a ground-signal-ground-signal-ground (GSGSG) pattern. FIG. 6 illustrates the allocation of a four-terminal test-key 30 according to a ground-signal-signal-ground (GSSG) pattern. In each of the embodiments shown in FIGS. 5 and 6, ports port1 and port2 are aligned to line 34, ports port3 and port4 are aligned to line 36, and line 34 is parallel to line 36. Further, lines 34 and 36 may be perpendicular to the lengthwise direction of scribe line 32, although they can also be allocated to parallel to the lengthwise direction of scribe line 32. In the embodiments shown in FIGS. 3, 5, and 6, ground ports G may be disposed symmetrically relative to DUT 20 in top views of the respective wafers 100, for example, in a rotational symmetric pattern.

For measuring test-keys 30 in FIGS. 5 and 6, when measuring through ports port1 and port2, wafer 100 may be placed in a direction, so that the probe card may contact ports port1 and port2 accurately to extract the electrical property of capacitor 22. When measuring through ports port3 and port4, wafer 100 may be shifted by a distance without being rotated, so that the probe card may contact ports port3 and port4 accurately to extract the electrical property of capacitor 24.

Figure 7:
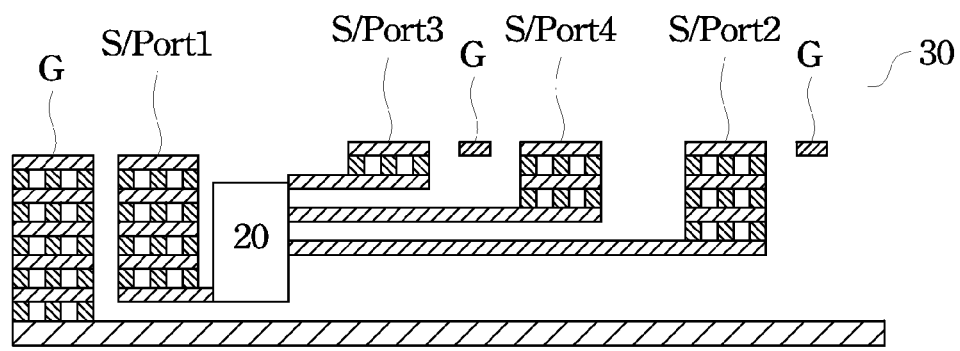
FIG. 7 illustrates the connection between a device-under-test (DUT) in a test-key, and respective ports connected to the DUT.

FIG. 7 schematically illustrates DUT 20, and shows how ports port1 through port4 ("S") are electrically coupled to DUT 20 through metal lines and vias. It is noted that although ports port1 through port 4 are illustrated in the same cross-sectional view, they may actually be on different planes, as illustrated in FIGS. 3, 5, and 6.

By forming DUTs including stacked capacitors, the chip area that is used for forming process design kits may be saved. Furthermore, by forming different DUTs including capacitors extend into different metal layers, the process variation for each of the metal layers may be extracted. For example, if a capacitor of a first DUT extends into metal layers M1 through M3, while a capacitor of a second DUT extends into metal layers M1 through M4, then the additional process variation of the second DUT over the process variation of the first DUT is caused by metal layer M4, and hence the process variation of metal layer M4 may be extracted, and is used to direct the circuit design.

In accordance with embodiments, a device includes a first MOM capacitor; a second MOM capacitor directly over and vertically overlapping the first MOM capacitor, wherein each of the first and the second MOM capacitors includes a plurality of parallel capacitor fingers; a first and a second port electrically coupled to the first MOM capacitor; and a third and a fourth port electrically coupled to the second MOM capacitor. The first, the second, the third, and the fourth ports are disposed at a surface of a respective wafer.

In accordance with other embodiments, a wafer includes a semiconductor substrate; and a plurality of metal layers over the semiconductor substrate. The wafer further includes a first and a second chip; a scribe line between the first and the second chips; and a test-key in the scribe line. The test-key includes a DUT including a first MOM capacitor extending through a first plurality of metal layers; and a second MOM capacitor extending through a second plurality of metal layers over the first plurality of metal layers. The first and the second plurality of metal layers belong to the plurality of metal layers. At least a portion of the first MOM capacitor vertically overlaps a portion of the second MOM capacitor. The wafer further includes a first and a second port at a top surface of the wafer and electrically coupled to the first MOM capacitor; and a third and a fourth port at the top surface of the wafer and electrically coupled to the second MOM capacitor.

In accordance with yet other embodiments, a wafer includes a semiconductor substrate and a plurality of metal layers over the semiconductor substrate; a first and a second chip in the wafer; a scribe line between the first and the second chips; and a test-key in the scribe line. The test-key includes a DUT, which further includes a first MOM capacitor extending into a bottom metal layer of the wafer; and a second MOM capacitor directly over the first MOMS capacitor, and extending into a top metal layer of the wafer. An entirety of the first MOM capacitor substantially overlaps an entirety of the second MOM capacitor.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a wafer comprising a plurality of metal layers;
   a first metal-over-metal (MOM) capacitor comprising portions extending through a first plurality of metal layers of the wafer;
   a second MOM capacitor comprising portions extending through a second plurality of metal layers of the wafer, the second MOM capacitor being positioned directly over and vertically overlapping the first MOM capacitor, wherein each of the first and the second MOM capacitors comprises a plurality of parallel capacitor fingers;
   a first and a second port electrically coupled to the first MOM capacitor; and
   a third and a fourth port electrically coupled to the second MOM capacitor, wherein the first, the second, the third, and the fourth ports are disposed at a surface of the wafer and the first, the second, the third and the fourth ports are electrically disconnected from each other.

2. The device of claim 1, wherein the respective wafer comprises a first and a second chip, with a scribe line between the first and the second chips, and wherein the first, the second, the third, and the fourth ports and the first and the second MOM capacitors are disposed in the scribe line.

3. The device of claim 2, wherein the first and the second ports are aligned to a first line, and the third and the fourth ports are aligned to a second line, wherein a first one of the first and the second lines is parallel to a longitudinal direction of the scribe line, and wherein a second one of the first and the second lines is perpendicular to the longitudinal direction.

4. The device of claim 2, wherein the first and the second ports are aligned to a first line, and the third and the fourth ports are aligned to a second line, and wherein the first and the second lines are parallel to a longitudinal direction of the scribe line.

5. The device of claim 1 further comprising a plurality of ground ports at the surface of the respective wafer, wherein in a top view of the respective wafer, the plurality of ground ports are disposed symmetrically relative to the first and the second MOM capacitors.

6. The device of claim 1 further comprising:
   a third MOM capacitor;
   a fourth MOM capacitor directly over and vertically overlapping the third MOM capacitor;
   a fifth and a sixth port electrically coupled to the third MOM capacitor; and
   a seven and a eighth port electrically coupled to the fourth MOM capacitor, wherein the fifth, the sixth, the seventh, and the eighth ports are disposed at the surface of the respective wafer, and wherein the first and the third MOM capacitors extend into different metal layers of the respective wafer, or the second and the fourth MOM capacitors extend into different metal layers of the respective wafer.

7. The device of claim 1, wherein each of the first and the second MOM capacitors comprises portions extending into at least three metal layers of the respective wafer, and the each of the first and the second MOM capacitors comprises, in each of the at least three metal layers:
   a first plurality of capacitor fingers;
   a first bus interconnecting the first plurality of capacitor fingers;
   a second plurality of capacitor fingers disconnected from the first plurality of capacitor fingers; and
   a second bus interconnecting the second plurality of capacitor fingers.

8. The device of claim 1, wherein the first MOM capacitor extends into a bottom metal layer (M1) of the respective wafer, and the second MOM capacitor extends into a top metal layer (Mtop) of the respective wafer.

9. The device of claim 1, wherein the first and the second MOM capacitors occupy substantially a same chip area, with an entirety of the first MOM capacitor vertically overlapping an entirety of the second MOM capacitor.

10. A device comprising:
    a wafer comprising:
       a semiconductor substrate; and
       a plurality of metal layers over the semiconductor substrate;
    a first and a second chip in the wafer;
    a scribe line between the first and the second chips; and a test-key in the scribe line and comprising:
: a first device-under-test (DUT) comprising:
: : a first metal-over-metal (MOM) capacitor extending through a first plurality of metal layers; and
: : a second MOM capacitor extending through a second plurality of metal layers over the first plurality of metal layers, wherein the first and the second plurality of metal layers belong to the plurality of metal layers, and wherein at least a portion of the first MOM capacitor vertically overlaps a portion of the second MOM capacitor;
: a first and a second port at a top surface of the wafer and electrically coupled to the first MOM capacitor; and
: a third and a fourth port at the top surface of the wafer and electrically coupled to the second MOM capacitor, wherein the first port, the second port, the third port and the fourth port are electrically disconnected from each other.

11. The device of claim 10, wherein the first and the second ports are aligned to a first line, and the third and the fourth lines are aligned to a second line un-parallel to the first line.

12. The device of claim 11, wherein the first line is perpendicular to the second line.

13. The device of claim 10, wherein the first and the second ports are aligned to a first line, and the third and the fourth lines are aligned to a second line parallel to the first line.

14. The device of claim 10, wherein an entirety of the first MOM capacitor substantially vertically overlaps an entirety of the second MOM capacitor.

15. The device of claim 10 further comprising:
: a second DUT in an additional scribe line of the wafer and comprising:
: : a third MOM capacitor extending through a third plurality of metal layers, wherein a first count of the first plurality of metal layers is different from a second count of the third plurality of metal layers; and
: : a fourth MOM capacitor directly over the third MOM capacitor.

16. The device of claim 10, wherein the test-key further comprises a plurality of ground ports adjacent the first, the second, the third, and the fourth ports, and wherein the ground ports are disposed at the top surface of the wafer.

17. A device comprising:
: a wafer comprising:
: : a semiconductor substrate; and
: : a plurality of metal layers over the semiconductor substrate;
: a first and a second chip in the wafer;
: a scribe line between the first and the second chips; and
: a test-key in the scribe line and comprising:
: : a device-under-test (DUT) comprising:
: : : a first metal-over-metal (MOM) capacitor extending into a bottom metal layer of the wafer; and
: : : a second MOM capacitor directly over the first MOM capacitor, and extending into a top metal layer of the wafer, wherein an entirety of the first MOM capacitor substantially overlaps an entirety of the second MOM capacitor, and wherein the first MOM capacitor is electrically disconnected from the second MOM capacitor.

18. The device of claim 17, wherein the test-key further comprises:
: a first and a second port at a top surface of the wafer and electrically coupled to the first MOM capacitor; and
: a third and a fourth port at the top surface of the wafer and electrically coupled to the second MOM capacitor.

19. The device of claim 18, wherein the first and the second ports are aligned to a first line, and the third and the fourth lines are aligned to a second line perpendicular to the first line.

20. The device of claim 17, wherein a lowest metal layer of the second MOM capacitor is one metal layer above a highest metal layer of the first MOM capacitor.

\* \* \* \* \*